United States Patent [19]

Bassous et al.

[11] Patent Number: 4,978,421
[45] Date of Patent: Dec. 18, 1990

[54] MONOLITHIC SILICON MEMBRANE DEVICE FABRICATION PROCESS

[75] Inventors: Ernest Bassous, Bronx; Joseph M. Blum, Yorktown Heights; Kevin K. Chan, Staten Island; Angela C. Lamberti, Putnam Valley; Constantino Lapadula; Istvan Lovas, both of Mahopac; Alan D. Wilson, Armonk, all of N.Y.

[73] Assignee: International Business Machines Corporation, Armonk, N.Y.

[21] Appl. No.: 435,216

[22] Filed: Nov. 13, 1989

[51] Int. Cl.⁵ .................... H01L 21/306; B44C 1/22; C03C 15/00; C03C 25/06
[52] U.S. Cl. .................... 156/645; 156/628; 156/647; 156/651; 156/653; 156/657; 156/659.1; 156/662
[58] Field of Search .............. 156/645, 647, 651, 653, 156/654, 657, 659.1, 661.1, 662, 628; 252/79.1, 79.3, 79.5

[56] References Cited

U.S. PATENT DOCUMENTS

| | | | |
|---|---|---|---|
| 4,372,803 | 2/1983 | Gigante | 156/628 X |
| 4,384,919 | 5/1983 | Casey | 156/645 |
| 4,443,293 | 4/1984 | Mallon et al. | 156/647 |
| 4,543,266 | 9/1985 | Matsuo et al. | 427/38 |
| 4,588,472 | 5/1986 | Shimizu | 156/647 X |
| 4,622,098 | 11/1986 | Ochiai et al. | 156/645 |
| 4,661,201 | 4/1987 | Petridis et al. | 156/654 X |
| 4,668,336 | 5/1987 | Shimkunas | 156/643 |
| 4,680,243 | 7/1987 | Shimkunas et al. | 430/5 |
| 4,701,391 | 10/1987 | Lentfer et al. | 430/5 |
| 4,889,590 | 12/1989 | Tucker et al. | 156/659.1 X |

Primary Examiner—William A. Powell
Attorney, Agent, or Firm—John J. Goodwin

[57] ABSTRACT

The method of fabrication of a monolithic silicon membrane structure in which the membrane and its supporting framework are constructed from a single ultra thick body of silicon. The fabrication sequence includes the steps of providing a doped membrane layer on the silicon body, forming an apertured mask on the silicon body, and removal of an unwanted silicon region by mechanical grinding and chemical etching to provide a well opening in the silicon body terminating in the doped membrane.

7 Claims, 3 Drawing Sheets

COOLING WATER

MONOLITHIC SILICON MEMBRANE DEVICE FABRICATION PROCESS

BACKGROUND OF THE INVENTION

1. Field of the Invention The present invention relates to static and dynamic silicon device structures which incorporate a very thin membrane or diaphragm and are useful in lithographic and sensor applications. This invention relates in particular to the fabrication of a monolithic silicon membrane device structure in which the membrane and its supporting framework are constructed from a single slab or slug of thick silicon.

2. Description of the Prior Art

U.S. Pat. No. 4,543,266, issued Sept. 24, 1985 to Matsuo et al entitled METHOD OF FABRICATING A MEMBRANE STRUCTURE, describes a structure wherein a thin film which becomes a membrane is formed over one major surface of a substrate by a plasma deposition process utilizing microwave electron cyclotron resonance. The substrate is then removed, other than a portion of the substrate which remains as a frame, so as to form a membrane structure. A dense and high quality membrane is formed at a low temperature and the internal stress of the membrane controlled by varying the conditions under which the plasma deposition process is carried out and by heat treating the thin film after its formation.

More particularly, the membrane mask structure, used for X-ray lithography, comprises a silicon nitride membrane having a thickness of 0.5 to 2 $\mu$m and an area of 20$\times$20 mm in either or both directions, and a frame portion composed of silicon. The structure is made by a process including the steps of depositing a thin film of silicon nitride onto a silicon wafer, applying a mask pattern to the bottom of the wafer, and etching the patterned wafer in 20% KOH to provide a frame-supported membrane structure.

U.S. Pat. No. 4,622,098, issued Nov. 11, 1986 to Ochiai et al entitled METHOD FOR MANUFACTURING SEMICONDUCTOR STRAIN SENSOR, relates to the manufacture of a semiconductor strain sensor but discloses the steps of forming a blind hole in a silicon substrate by mechanical grinding and wet etching to provide a framed membrane-like structure.

More particularly, a semiconductor strain sensor having a semiconductor substrate having a pair of major surfaces parallel to each other. The substrate is worked to constitute a frame and a thin diaphragm by forming a circular blind hole from one major surface. The bottom surface of the blind hole is formed in a conical shape projecting upward from the edge portion to a central portion thereof. The substrate has a thickness of not less than 0.5 mm and not less than about five times that of the diaphragm. The blind hole is formed by grinding and the inner surface of the blind hole is then etched to eliminate a scratch formed in the inner surface by grinding. Resistance layers are formed on the other major surface of the substrate. Each layer has a piezoresistance which varies in accordance with the pressure applied to the diaphragm.

U.S. Pat. No. 4,701,391, issued Oct. 20, 1987 to Lentfer et al entitled MASK WITH MAGNESIUM DIAPHRAGM FOR X-RAY LITHOGRAPHY, describes a structure wherein a mask for X-ray lithography is formed of a multilayer diaphragm with a patterned absorber layer on the diaphragm. The diaphragm includes a layer of magnesium and at least one intermediate layer.

U.S. Pat. No. 4,680,243, issued July 14, 1987 to Shimkunas et al entitled METHOD FOR PRODUCING A MASK FOR USE IN X-RAY PHOTOLITHOGRAPHY AND RESULTING STRUCTURE, describes a method for manufacturing a mask for use in X-ray photolithographic processes including the step of coating a silicon wafer with a layer of boron nitride. A masking substance is used to coat one side of the boron nitride coated wafer, and the boron nitride is etched off of the other side of the wafer. The wafer is then bonded to a pyrex ring using a field assisted thermal bonding process. During the field assisted thermal bonding process, the silicon is bonded directly to the pyrex. Then a zirconium layer is used to cover the mask and is selectively etched where it is desired to remove a circular portion of the silicon. Thereafter the silicon is subjected to a semianisotropic etch. The remaining structure includes a pyrex ring bonded to a silicon ring across which a layer of boron nitride is stretched. The layer of boron nitride is subjected to an annealing process and is then coated with an X-ray opaque material.

U.S. Pat. No. 4,668,336, issued May 26, 1987 to Shimkunas entitled PROCESS FOR MAKING A MASK USED IN X-RAY PHOTOLITHOGRAPHY, describes a method of manufacturing a mask for use in X-ray photolithography including the steps of coating a set of wafers with boron nitride. The tension in the boron nitride is measured by using a capacitive probe to measure bowing in a set of test wafers. The remaining wafers are attached to a pyrex ring, and the boron nitride is removed from one side of the wafers. A circular hole is then etched in the wafer, and a layer of tantalum and gold are formed on the remaining boron nitride membrane. The gold is patterned via a sputter etching process. Power is reduced at the end of the sputter etching process slowly to reduce mechanical stress in the mask. The tantalum is then etched via a reactive ion etching process. In this way, an X-ray transparent boron nitride membrane is used to support X-ray opaque gold.

U.S. Pat. No. 4,384,919, issued May 24, 1983 to Casey entitled METHOD OF MAKING X-RAY MASKS, describes a process wherein an X-ray mask is made by forming a thin polymide membrane on a silicon wafer substrate which is then back-etched to form a mask supporting ring of the substrate.

The IBM Technical Disclosure Bulletin, Vol. 20, No. 7, Dec. 1977, pages 2868–2871, contains a publication by Castellani et al entitled "Fabrication of E-Beam Projection and X-Ray Masks On A Support Frame" which describes a process for fabrication of both E-Beam projection masks and X-Ray lithography masks wherein the initial substrate serves not only as a carrier through the fabrication but, upon completion of the fabrication, remains as a rigid supporting ring for the fabricated mask. The active area of the mask is not handled in any way after the mask fabrication is completed so no distortion due to mechanical handling or relaxation of the mask or mask substrate results.

The present invention is distinct from the teachings of the prior art references because it provides a monolithic silicon membrane structure superior to the hybrid structures of the prior art due to its greater structural stability and ease of fabrication.

SUMMARY OF THE INVENTION

In many silicon membrane device structures, the mechanical and structural characteristics of the membrane and the frame that supports it play a key role in the function and performance of the device. Static silicon membrane structures include shadow masks for lithographic applications using X-ray, electron-beam, and ion-beam sources, and as mechanical filters for the selective deposition of evaporated materials. Dynamic devices which incorporate deflectable silicon diaphragms include silicon sensors, probes, actuators and optical filters. For most of these applications, it is critically important that the thin large-area membrane be free from surface distortions and display a high degree of mechanical uniformity and stability.

An object of the present invention is to provide a structure and fabrication procedure for an all silicon, i.e., monolithic, X-ray mask substrate.

Another object of the present invention is to provide a monolithic silicon X-ray mask substrate consisting of a large diameter boron-doped silicon membrane that is an integral part of a very thick silicon substrate material such as a slug 100 mm diameter, 6.4 mm thick, a membrane 50 mm diameter in the center, 3 $\mu$m thick.

A further object of the present invention is to provide a process for making a monolithic silicon X-ray mask wherein the fabrication sequence includes boron diffusion, silicon nitride deposition, precision mechanical grinding and wet chemical etching to form the boron-doped silicon membrane in which the membrane surface is protected at all times by a thin layer such as silicon nitride.

DESCRIPTION OF THE PREFERRED EMBODIMENTS

Figure 1:
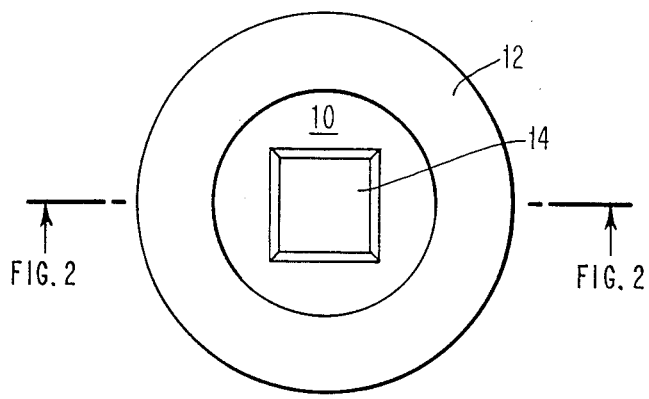
FIGS. 1 and 2 are schematic illustrations of top and orthogonal views of an X-ray mask according to the prior art.
Figure 2:
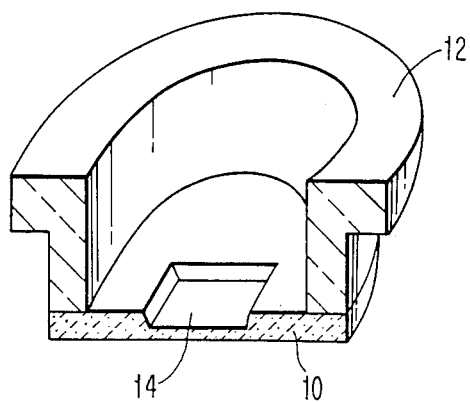

The importance of a distortion-free and mechanically stable membrane is discussed herein relative to the embodiment of an X-ray mask substrate of the prior art as illustrated in FIGS. 1 and 2. According to the prior art an X-ray mask substrate is generally constructed from two structural members: a thin standard silicon wafer 10 incorporating a very thin large-area membrane 14 at its center, and a supporting frame or ring 12 to which this membrane wafer is bonded. To make the X-ray mask, a high-resolution, high-density circuit pattern delineated in gold or tungsten is deposited on the the membrane region of the substrate. The circuit pattern which serves as the master pattern for replicating X-ray images is totally supported on a membrane approximately 2-3 $\mu$m thick.

More particularly, referring to FIGS. 1 and 2, top and perspective illustrations are provided showing a hybrid X-ray mask known in the prior art. In FIGS. 1 and 2, the hybrid mask includes the aforesaid element 12 composed, for example, of heat resistant glass formed in a ring having an outside diameter of, for example, 100 millimeters, a ridge or lip portion with an outside diameter of, for example, 125 millimeters. The ring 12 may have a thickness of, for example 10 millimeters.

A silicon wafer 10 composed of silicon or other suitable thin film material is bonded to the bottom of glass ring 12. The silicon wafer 10 will have an outside diameter equal to that of the glass ring 12, i.e., 100 millimeters and a thickness of, for example, 0.64 millimeters except in the center region thereof which is made much thinner to provide a membrane 14 of silicon in the order of 2-3 microns thick. The area of the thin membrane may be, for example, 25 millimeters by 25 millimeters square.

The silicon membrane 14 is doped with boron.

In X-ray lithography, the master pattern is projected onto a secondary surface by means of incident X-rays which are transmitted through the membrane. For the fabrication of high-density integrated circuits with submicrometer features it is essential that the projected image on the secondary surface be identical to the master pattern on the membrane surface. To achieve faithful replication of the same image thousands of times throughout the life of the mask demands that the dimensional and spatial characteristics of the master pattern be exceptionally stable. The slightest distortion or shift of the membrane surface results in undesirable variations in the geometry of the replicated image. Eliminating or minimizing membrane distortions is thus of utmost importance in the fabrication and use of X-ray masks.

Similar considerations apply to membrane masks which rely on transmission or shadow masking to replicate features that are defined on the membrane surface, as in ion beam and electron beam lithography. Again, as in X-ray lithography, the replication process is degraded by surface distortions which exist initially in the membrane, or are induced during the fabrication or use of the mask. For best lithographic performance therefore, mechanically stable and distortion-free membranes are essential requirements.

In dynamic micromechanical devices such as sensors and transducers, the displacement or deflection of the membrane corresponds to the change in the variable that is being measured, e.g., pressure, position, intensity, electric charge, etc. Maximum sensitivity of the device is displaYed when fluctuations in membrane displacement resulting from surface distortion are eliminated or minimized.

A hybrid silicon membrane device structure, such as an X-ray mask substrate that is built according to the prior art from a standard silicon membrane wafer bonded to a supporting ring is subject to considerable surface distortion arising from three major sources:

1. Initial Wafer Flatness

The free-standing surface flatness or warp of a standard silicon wafer 100 mm in diameter, approximately 600 $\mu$m thick is generally larger than 10 $\mu$m. Such a large warp is due to the fact that a standard wafer is too thin and therefore easily distorted during the manufacture of wafers from silicon ingots by the well-known sawing, lapping and polishing operations. Consequently, a membrane 2-3 $\mu$m thick that is formed by local etching of a region in a standard wafer will display a surface distortion that is equal to or greater than its initial warp.

Increasing the thickness of a silicon wafer provides a means to reduce surface distortion due to its increased stiffness. For example, a 6 mm thick silicon wafer is ten times thicker than a standard wafer, and therefore less prone to distortion from mechanical stresses that are applied during wafer preparation. Silicon slugs in wafer form 6 mm thick, for example, are readily produced with a warp less than 3 μm across a surface 100 mm in diameter using conventional silicon polishing methods.

2. Distortion from Bonding

The frame or ring that supports the membrane wafer is usually made of PYrex brand glass. The latter must be made thick and flat with less warp than the wafer itself in order to avoid membrane distortion after the wafer and supporting ring are bonded. The anodic bonding process employed to attach the ring to the wafer involves clamping the ring and membrane wafer at elevated temperature for prolonged periods of time. Despite the flatness of the ring, the bonding process induces distortions of the membrane surface due to the clamping forces. A similar effect occurs when adhesives requiring elevated curing temperatures are employed.

3. Differential Thermal Expansion

Differences in the thermal expansion of glass and silicon induce distortions in the membrane master pattern of a glass-silicon X-ray mask. Differential thermal expansion occurs during the heating and cooling steps of the mask fabrication process. Furthermore, X-rays incident on the membrane during lithographic exposures also cause heating and expansion of the membrane area. Membrane distortion of a glass-silicon hybrid structure cause a corresponding distortion or displacement of the X-ray image.

Figure 3:
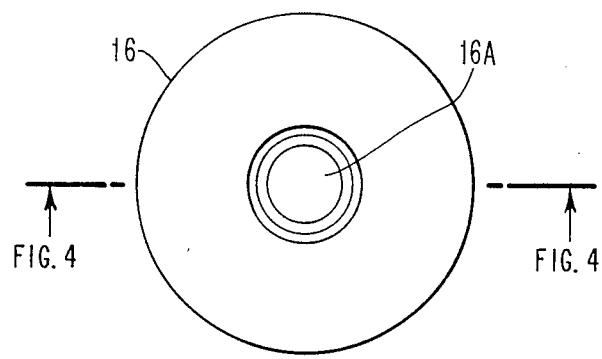
FIGS. 3 and 4 are schematic illustrations of top and orthogonal views of an embodiment of a monolithic silicon X-ray mask according to the principles of the present invention.
Figure 4:
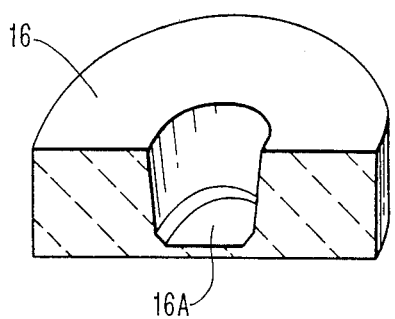

Referring to FIGS. 3 and 4, schematic illustrations of top and perspective views of an all silicon, one-piece monolithic X-ray mask embodiment of the present invention are provided.

A circular slug of silicon 16, for example, 100 millimeters in outside diameter contains a circular inside opening, for example, 50 millimeters to 80 millimeters in diameter which, at the bottom of slug 16 terminates to provide an approximately 2-3 micron thick boron doped membrane 16A which is an integral part of the body of slug 16. Slug 16 may have a thickness of, for example, 6.4 millimeters.

A thick monolithic silicon X-ray mask substrate, as shown in FIG. 3, has the advantage that it suffers from less warpage and distortion, and is easier to fabricate than prior art substrates made by bonding a silicon membrane wafer to a thick pyrex glass ring.

Other advantages of the present invention are that low initial warpage of the substrate is more readily achieved in silicon slugs that are 10×thicker than standard wafers, 6500 μm vs. 650 μm thick and distortions caused by differences in thermal expansion between glass and silicon do not occur in an all-silicon substrate. Also, potential distortions from the glass-to-silicon bonding process are eliminated and the elimination of the bonding process simplifies mask fabrication.

The fabrication sequence for 6.4 mm thick silicon slugs includes procedures for cleaning, diffusion and silicon nitride deposition. Removal of unwanted silicon to form the membrane was performed by first mechanical grinding or isotropic chemical etching to reduce the thickness from about 6.4 to approximately 1 mm, and finally chemical etching to the boron-doped membrane layer.

The fabrication sequence is as follows:

Select thick wafer with warpage less than, for example, 3 μm, then proceed:

Step 1. Wafer cleaning;
Step 2. Boron-doped membrane layer;
Step 3. Strip and clean by etching;
Step 4. Silicon nitride deposition;
Step 5. Silicon removal by:
  (a) Precision mechanical grinding;
  (b) Isotropic chemical etching;
Step 6. Anisotropic silicon etching;
Step 7. Strip and clean.

More particularly, in the present invention, the three sources which contribute to membrane distortion are eliminated by fabricating the membrane device structure as a self-supporting member that is constructed from a single thick wafer or slug of silicon. Firstly the built-in initial distortion that is present in a standard thin wafer is considerably reduced due to the greater stiffness of the slug or slab, which can for example be ten times thicker than a standard wafer. Secondly, because the monolithic membrane structure in thick silicon is stable and self-supporting, a glass frame is not required, thereby eliminating the potential distortions associated with the glass-silicon bonding process. Finally, because the membrane structure is monolithic, i.e., it is made from a single material, uniform expansion and contraction occur without the thermal stresses that result from a structure made from dissimilar materials.

In sum, the monolithic membrane structure built from a thick silicon wafer minimizes membrane distortion effects by (1) using better starting silicon material, (2) eliminating a complex bonding process, and (3) avoiding stresses from thermal effects.

The major challenge in fabricating a monolithic membrane device in a thick silicon wafer is the removal of unwanted silicon to form the membrane. Details of this step are discussed below in the context of an X-ray mask substrate fabrication process.

FABRICATION

Typical physical dimensions of an X-ray mask substrate are as follows:

1. Initial silicon wafer thickness is in the range of 5-10 mm.
2. Wafer diameter 100 mm.
3. Membrane diameter 50-80 mm.
4. Membrane thickness approximately 3 μm.

The fabrication process involves two major operations: (1) the formation of the membrane surface layer by boron doping, and (2) the removal of unwanted silicon from the wafer to define the membrane itself. The result of these two process steps are illustrated in FIGS. 3 and 4.

Boron doping

The membrane layer 16A of FIGS. 3 and 4 is formed in the wafer 16 surface by a boron doping process using thermal diffusion or ion implantation from a boron source, or by epitaxial deposition of boron-doped silicon on the wafer surface. The depth of the diffusion layer or the thickness of the epitaxially deposited boron-doped layer (approximately 3 μm thick) represents the final thickness of the membrane. Silicon above the membrane layer is selectively removed with a silicon etchant which does not attack the boron doped layer. To achieve high etch selectivity in an etchant such as potassium hydroxide (KOH), the concentration of boron in the doped layer should exceed about $1 \times 10^{20}/cm^3$. With this etchant, silicon etching stops at the interface between the doped and undoped regions near the surface. Boron doping and epitaxial deposition processes are well-known in silicon microfabrication technology.

Silicon Removal

Uniform and controlled removal of unwanted silicon from a wafer 16 which is, for example, 5-10 mm thick to form a membrane 16A which is, for example, 2-3 $\mu$m thick is performed in two stages. In the first stage, 80-90% of the wafer thickness is removed rapidly and uniformly in a non-selective manner. In the second stage, the remaining silicon is etched selectively in an anisotropic etching solution. The latter will attack undoped silicon only without affecting the heavily boron-doped membrane layer.

Two methods are employed to remove silicon uniformly from a thick wafer in a rapid but non-selective manner. The first involves precision mechanical grinding and the second method utilizes isotropic chemical etching. Both methods are non-selective because they are insensitive to the dopant impurity in the silicon wafer. Both methods are practical processes that have been successfully demonstrated for membrane formation.

Precision Grinding

Precision mechanical grinding is performed with a water-cooled diamond-impregnated cutting wheel mounted on a curve generating machine to define the desired work area. The operation is similar to that used in grinding and polishing optical components such as glass lenses, prisms and mirrors. The thick silicon slug is wax-mounted on an optical flat to protect the membrane side of the wafer. It is also accurately aligned horizontally to maintain parallelism of top and bottom surfaces. The speed of the grinding wheel is selected to prevent excessive damage from penetrating deep below the silicon surface. With a silicon wafer 5-10 mm thick, the preferred approach is to grind a well or a blind hole such that all but approximately 1 mm of the wafer thickness is removed. The total grinding time for a wafer 5 mm thick is typically less than 10 minutes. The thickness variation in the remaining silicon is less than 50 $\mu$m.

After the wafer is separated from its holder and the wax cleaned off it is immersed in a selective anisotropic etchant for several hours to remove the remaining undoped silicon.

Isotropic Etching

Isotropic chemical etching in mixtures of hydrofluoric acid and nitric acid is another useful technique for rapidly removing silicon from a thick wafer. As in grinding, this method is non-selective and is applied for the removal of all but 1 mm of a wafer that is initially 5-10 mm thick.

The preferred approach for isotropic etching is to mount the wafer in a water-tight holder to protect the membrane surface and the edge of the wafer. The area exposed to the acid solution defines the membrane area. The holder is immersed in water to cool and protect the membrane side of the wafer. A few milliliters of a mixture of hydrofluoric acid and nitric acid (1:1 by volume) is allowed to attack the exposed silicon surface, and is replenished every 30-60 seconds. At an average silicon etch rate of 50 $\mu$m per minute, the total etching process is completed in about 80 minutes for a wafer approximately 5 mm thick.

After removing the wafer from its holder and cleaning it, selective anisotropic etching is applied to etch the remaining silicon to form the membrane layer.

Selective Chemical Etching

Chemical etching solutions which are normally used for etching silicon selectively and anisotropically include potassium hydroxide (KOH) solutions and mixtures of ethylenediamine, pyrocatechol and water (EPW). These etchants attack all forms of silicon very rapidly with the exception of silicon containing boron concentrations in excess of about $1 \times 10^{20}/cm^3$. A silicon layer heavily doped with boron will therefore resist etching when the lightly doped substrate of which it is an integral part is back-etched in EPW or KOH. The use of EPW and KOH solutions for making membranes is well-known and discussed in the literature.

Fabrication Sequence

The detailed fabrication sequence involving boron doping followed by silicon removal varies considerably depending on the final device design and application. For a given design, options also exist in materials, tools and processing techniques. Consequently no single sequence or method is applicable for fabricating all types of silicon membrane device structures. The sequence outlined below with some alternatives illustrates what is typically employed in the fabrication of a silicon membrane. The latter is an integral part of a silicon wafer 5-10 mm thick and when completed is used for example as an X-ray mask substrate. The processes mentioned below are based on microfabrication methods that are commonly employed in the manufacture of silicon integrated circuits.

Only wafers which meet the following specifications are preferred:

Thickness 5-10 mm. Warp or flatness less than 3 $\mu$m on both sides;

Surfaces which are defect free and polished;

Thickness uniformly better than 5 $\mu$m.

Step 1. Wafer clean.

Step 2. Boron doping.

Diffusion.

One or preferably both surfaces of the wafer is doped with a boron concentration in excess of $1 \times 10^{20}/cm^3$ to a depth of approximately 3 $\mu$m. Doping is performed from a gas, liquid or solid boron source and thermal diffusion of the dopant is performed at temperatures in excess of 1050° C. It is important that diffusion conditions be chosen to provide an infinite boron source in order to avoid boron depletion at the surface and to achieve the required high concentration of boron in the membrane layer assumed here to be 3 $\mu$m thick. Another key requirement is to ensure that the boron-rich top surface skin on the membrane layer is oxidized at the termination of the diffusion cycle. The post-diffusion oxidation in oxygen or water vapor is accomplished under conditions which would grow approximately 20 nm of silicon dioxide on a clean silicon surface. Failure to perform the post-diffusion oxidation will result in damaged or very poor membranes.

Ion Implantation.

Ion implantation of boron dopant atoms followed by high temperature annealing produces the same result and does not require the post-diffusion oxidation step. It is however, a more complex method and therefore, unattractive for low-cost applications.

Epitaxy.

An alternative method to form the membrane layer is to deposit by epitaxial methods a boron-doped single crystal silicon film approximately 3 $\mu$m thick. This film is deposited on one or preferably both surfaces of the wafer. Epitaxial deposition provides a unique way to adjust the mechanical strain in the deposited film by incorporating germanium and boron atoms simultaneously during the growth of the silicon film. The latter also forms a relatively defect-free layer which is not the case for boron-diffused or ion-implanted layers.

Step 3. Strip and Clean.

Any grown or deposited surface oxides are first stripped off the wafers in dilute hydrofluoric acid and then cleaned. Totally clean surfaces, free from residues or films, are preferred at this stage.

Step 4. Silicon Nitride Deposition.

A thin film of silicon nitride approximately 100 nm thick on both surfaces of the wafer serves as a protective and masking layer in the subsequent grinding and etching steps. Films obtained by chemical vapor deposition at high temperature are preferred for this purpose. Other films which serve the same purpose include silicon dioxide, silicon carbide and boron nitride.

Step 5. Rapid Non-selective Silicon Removal.

Precision Grinding.

As described above in the section on silicon removal, mechanical grinding is performed on one side of the wafer while the opposite side is wax-mounted on a horizontal flat holder. A well is formed whose depth is periodically measured during the grinding process. Both parallelism and uniform thickness of the remaining silicon at the bottom of the well must be maintained during the grinding process. The final thickness remaining is preferably about 1 mm and the crystal damage which is unavoidable should be confined to about 0.05 mm. Protection of front and back surfaces can be enhanced by overcoating silicon nitride with a protective polymer layer such as polyimide or photoresist baked at elevated temperature. Wax removal and wafer cleaning are performed in solvents and in strong hot mixtures of sulfuric and nitric acid.

Isotropic Chemical Etching.

Figure 5:
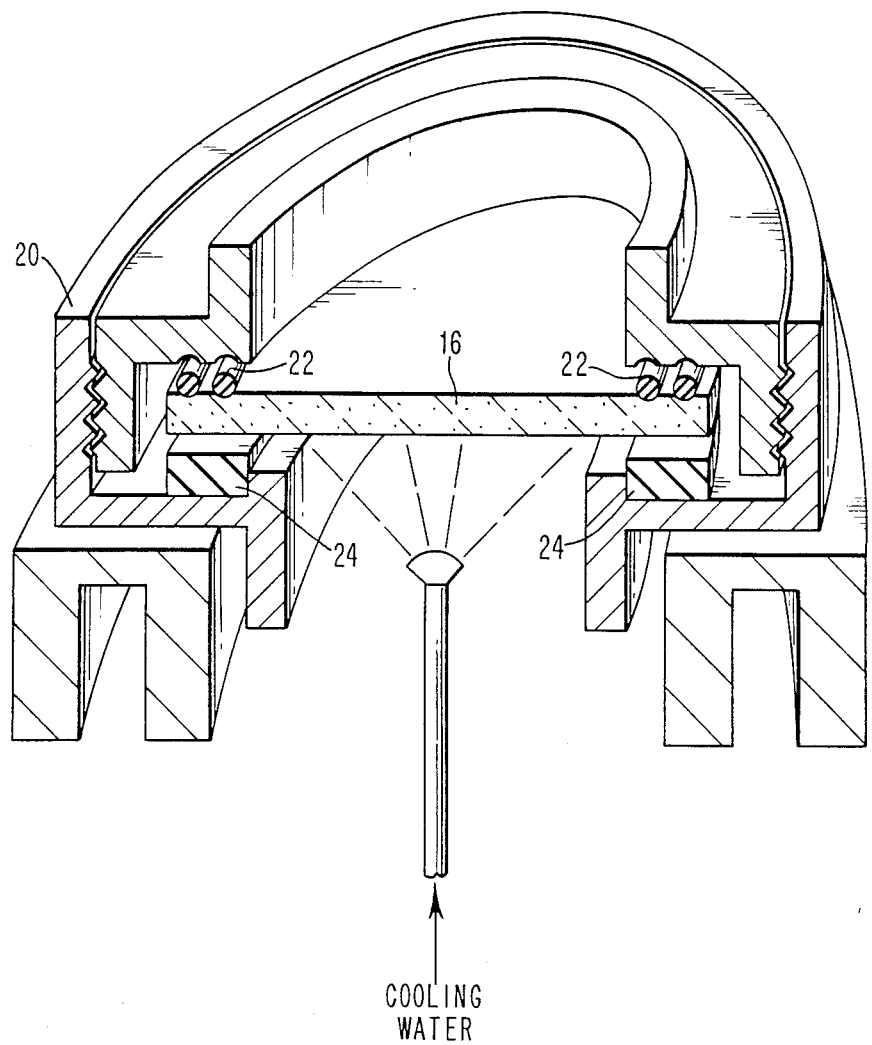
FIG. 5 is a schematic illustration of a holder for retaining a silicon wafer during fabrication of a mask.

Referring to FIG. 5, the wafer is mounted in a plastic fixture 20 with appropriate O-ring seals 22 that are resistant to chemical attack by mixtures of hyrofluoric (HF) and nitric acids ($HNO_3$) Preferred materials include Teflon (trademark of E.I.Dupont Co.), polyvinyl chloride and viton.

The area exposed to acid attack is defined by a double O-ring seal 22 and the unexposed surface is coated with an acid resistant wax or polymer such as polyimide and is supported in holder 20 by a gasket 24. In the exposed area the silicon nitride film is first removed in HF before the $HF+HNO_3$ acid mixture (1:1 by volume) is applied. The membrane side of the wafer is immersed in cold water at all times during etching in order to cool the wafer and prevent attack by the acid mixture. Predetermined etch rates establish the total etching time for the final thickness of silicon remaining at the bottom of the well. Because no crystal damage occurs with isotropic etching, the remaining thickness could be less than 1 mm. Wax removal and wafer cleaning are performed in solvents and in strong hot mixtures of sulfuric and nitric acid.

Step 6. Selective Silicon Etching.

Anisotropic chemical etching solutions based on potassium hydroxide (KOH) and mixtures of ethylenediamine (E), pyrocatechol (P) and water (W) are the preferred selective etchants to delineate the boron-doped membrane layer.

The etch selectivity between boron-doped silicon and the underlying silicon substrate must be very large. A low etch selectivity results in undesirable etching and thinning of the boron-doped membrane.

KOH. KOH solutions are less complex and safer to use than EPW. With KOH, the etching process is conducted in two steps. A solution of 20-30% KOH in water at 70-90° C. is first used to remove all but 50-100 $\mu m$ of silicon. The same solution saturated with excess isopropyl alcohol (IPA) is finally used to remove all the undoped silicon and stop at the membrane interface.

EPW. Silicon etching and membrane formation are achieved in one step using EPW. If masking films of silicon dioxide are used, EPW is the preferred etchant because KOH attacks silicon dioxide film more rapidly.

Step 7. Strip and Clean.

After membrane formation, the silicon nitride film on both surfaces is stripped in HF. At this stage, the fabrication of the basic monolithic membrane structure is complete. A new film of silicon nitride or other suitable material is coated on one or both sides of the structure depending on the application or subsequent processing requirements.

Having thus described our invention, what we claim as new, and desire to secure by Letters Patent is:

1. A method for fabricating a monolithic silicon membrane structure comprising the steps of:

Step 1. providing a doped silicon region of a selected depth on a silicon wafer surface to define a membrane layer, Step 2. masking a portion of said wafer surface opposite said membrane layer with an apertured mask layer leaving an area of said surface unmasked, Step 3. removing said undoped silicon wafer material beneath said unmasked area to form a well to expose an area of said doped membrane layer corresponding to said unmasked area of said apertured mask layer, Step 4. removing said apertured mask layer from said silicon wafer surface and cleaning said wafer structure to provide a monolithic silicon wafer structure including a well terminating in an integrated doped membrane layer.

2. A method for fabricating a monolithic silicon membrane structure according to claim 1 wherein said Step 3 includes the steps of removing a first amount of said silicon wafer material beneath said unmasked area by mechanical grinding and removing the remaining amount of said silicon wafer material beneath said unmasked area and above said doped membrane by selective chemical etching.

3. A method for fabricating a monolithic silicon membrane structure according to claim 1 wherein said Step 1 includes doping a silicon wafer surface with boron to form at least one boron doped membrane layer on said silicon wafer.

4. A method for fabricating a monolithic silicon membrane structure according to claim 1 wherein said silicon wafer is selected to manifest very low warpage of less than three micrometers and uniform thickness wherein the top and bottom surfaces of said wafer are parallel, polished and relatively defect free.

5. A method for fabricating a monolithic silicon membrane structure according to claim 3 wherein said silicon wafer is greater than 0.6 millimeters thick, and said doped membrane layer is greater than 1 micrometer thick.

6. A method for fabricating a monolithic silicon membrane structure according to claim 5 wherein said Step 2 includes depositing a mask approximately 100 nanometers thick composed of silicon nitride, silicon dioxide, silicon carbide or boron nitride.

7. A method according to claim 2 wherein said selective chemical etching includes etching said lightly doped or undoped silicon wafer material with a chemical etching solution based on potassium hydroxide or mixtures of ethylenediamine, pyrocatechol and water.

* * * * *